United States Patent
Watanabe et al.

[11] Patent Number: 6,114,762
[45] Date of Patent: Sep. 5, 2000

[54] ATOMIC WIRE AND ATOMIC WIRE SWITCH

[75] Inventors: Satoshi Watanabe, Wako; Yoshimasa Murayama, Koganei; Yoshimasa A. Ono, Mito; Tomihiro Hashizume, Saitama-ken; Yasuo Wada, Tokyo, all of Japan

[73] Assignee: Hitachi, Ltd., Tokyo, Japan

[21] Appl. No.: 08/915,730

[22] Filed: Aug. 21, 1997

[30] Foreign Application Priority Data

Aug. 22, 1996 [JP] Japan .................................. 8-221001

[51] Int. Cl.$^7$ ...................................................... H01L 23/48
[52] U.S. Cl. ............................................ 257/734; 257/739
[58] Field of Search ...................................... 257/734, 739

[56] References Cited

U.S. PATENT DOCUMENTS

| | | | |
|---|---|---|---|
| 5,561,300 | 10/1996 | Wada et al. | 250/492.2 |
| 5,694,059 | 12/1997 | Wada et al. | 326/62 |
| 5,705,231 | 1/1998 | Brueck et al. | 430/316 |
| 5,868,952 | 2/1999 | Hatakeyama et al. | 216/66 |
| 5,895,058 | 4/1999 | Hatekeyama et al. | 430/313 |

FOREIGN PATENT DOCUMENTS 5-175513 7/1993 Japan .
7-30093 1/1995 Japan .

OTHER PUBLICATIONS

Hashizume, Tomihiro, et al, "Property of a Hydrogen–Terminated Si (100) Surface", J. of the Korean Physical Society, vol. 31, No. 3, Sep. 1997, 452–55, Mar. 9, 1977.

Shen et al., "Atomic–Scale Desorption Through Electronic and Vibrational Excitation Mechanisms", Science, 268, Jun. 16, 1995, pp. 1590–1592.

Watanabe et al., "Electronic Structure of an Atomic Wire on a Hydrogen–Terminated Si (111) Surface First–Principles Study", Physical Review B, 52(15), pp. 768–771.

Shen et al., "Nanoscale Oxide Patterns on Si (100) Syrafaces", Appl. Phys. Lett., 66(8), Feb. 20, 1995.

Primary Examiner—Sara Crane
Attorney, Agent, or Firm—Antonelli, Terry, Stout & Kraus, LLP

[57] ABSTRACT

A fine wire is fabricated by supplying metal atoms to one row or a plurality of rows formed by extraction of terminated atoms or molecules at the surface of a substrate made non-conductive by terminating all dangling bonds on the surface thereof with atoms or molecules. The conductivity of the fine wire can be attained by supplying metal atoms larger in number to that required for just terminating dangling bonds formed by extraction of terminated atoms or molecules.

10 Claims, 3 Drawing Sheets

ATOMIC WIRE AND ATOMIC WIRE SWITCH

BACKGROUND OF THE INVENTION

1. Field of the Invention

The present invention relates to atomic-size conductive fine wires necessary for wiring interconnections between elements or between elements and electrodes in an integrated circuit of these elements of atomic-size or nanometer-size, and to atomic-size switches made of atomic-size fine wires having an electronic switching function.

2. Description of the Related Art

High integration and high speed operation of logic circuits using MOS transistors are progressing at a rapid pace as is well known. Such high integration and high speed operation are realized by fine patterns of each constituent element, and a minimum patterning size of transistors is now in the order of as small as 0.1 micron. Vigorous efforts are still being made in order to realize even finer structures without changing fundamental principles of such conventional technology. However, with the same conventional technology, it is supposed that such finer structures will encounter some limits sooner or later, because of various factors such as expansion of a depletion layer of a p-n junction, statistical errors, and increase of power consumption.

Under such circumstances, studies of microdevices have been made, based upon principles different from conventional principles. For example, various elements capable of reducing their size to atomic-size or nanometer-size have been proposed, such as atomic switches (refer to JP-A-5-175513). Although each specific element is given some approach to microminiaturization as above, it is important for microminiaturization of an integrated circuit not only to make each integrated element fine but also to make fine a wiring interconnection between elements for signal transfer. With advanced fine-pattern fabrication techniques, it is already possible to fabricate a conductive fine wire having a cross section of 1 nm square. For example, such conductive fine wires can be manufactured by using techniques such as techniques for embedded atomic fine wires (refer to JP-A-7-30093). It is still desired, however, to establish techniques of further reducing the size of fine wires without degrading conductivity thereof, in order to positively utilize the specific features of atomic-size elements.

A fine wire structure having a width of atomic-size can be manufactured by using techniques of finely patterning a solid surface by a scanning tunneling microscope, as reported for example in Science, 268 (1955), pp. 1590–1592. Using only these techniques is ghnot sufficient, however, to fabricate atomic-size fine wires having structural stability and conductivity. For example, an atomic-size fine wire formed by extraction of a row of hydrogen atoms from the surface of hydrogen-terminated silicon shows conductivity as reported in Physical Review B, 52 (1995), pp. 10768–10771. However, this fine wire is likely to become non-conductive through adsorption of environmental atoms or molecules so that it can only be used under an ultrahigh vacuum atmosphere. Atomic size conductive fine wires reported to date become non-conductive a very short time because of the above-described reason or because of migration of constituent atoms likely to be caused by thermal vibrations even at about a room temperature. In this context, conventional conductive fine wires are not structurally stable. On the other hand, most of structurally stable atomic-size fine wires are non-conductive. Conductive fine wires were successfully formed occasionally in the past. However, the reason for conductivity and manufacturing conditions to achieve this were clear at all. As described above, it can be said that fabrication methods of atomic-size fine wires with structural stability and conductivity are still not known.

SUMMARY OF THE INVENTION

The invention provides a method of fabricating an atomic-size fine wire having conductivity as well as structural stability. The invention allows microminiaturization of wiring interconnections between atomic-size or nanometer-size elements to thereby realize high integration of these microelements.

According to the present invention, in order to realize atomic-size fine wires with structural stability, a method is incorporated by which a row of atoms is extracted from the surface of non-conductive material to form a dangling bond wire and thereafter other atoms are adsorbed to the dangling bond wire. This method, in connection with oxygen gas, has already been reported, for example, in Applied Physics Letters, 66 (1995), pp. 976–979. In this invention, the number of atoms to be adsorbed to dangling bonds is controlled to thereby realize a fine wire having structural stability and conductivity.

DESCRIPTION OF THE PREFERRED EMBODIMENTS

Embodiments of the invention will be described in detail with reference to the accompanying drawings.

(1st Embodiment)

This embodiment discloses an example of the structure of an atomic-size fine wire having conductivity and its manufacture method.

Figure 1A:
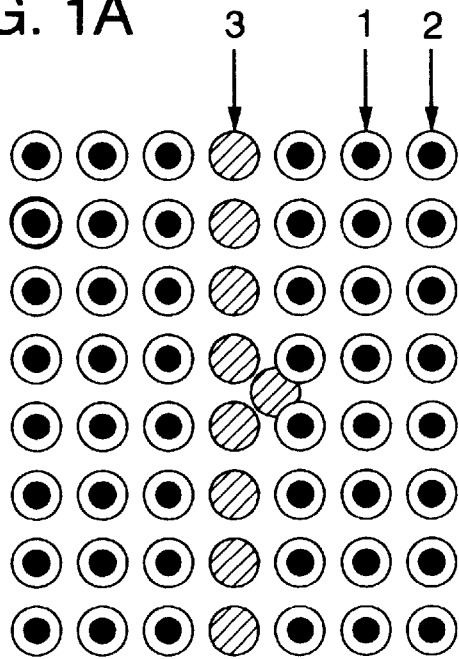
FIGS. 1A and 1B are diagrams showing an example of the structure of an atomic-size conductive fine wire as viewed downwards and as viewed sidewards, respectively.
Figure 1B:
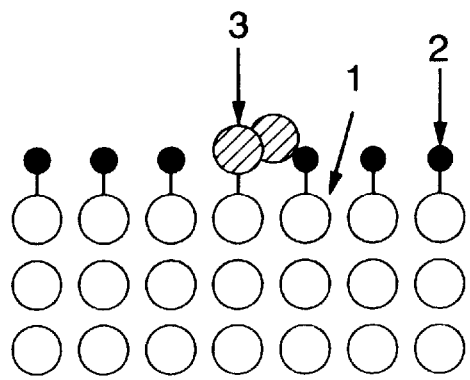

FIGS. 1A and 1B show the fundamental structure of an atomic-size conductive fine wire of this invention. FIG. 1A is a plan view of the atomic-size conductive fine wire and FIG. 1B is a side view thereof. A substrate used for this embodiment is made of insulator or semiconductor material whose dangling bonds of constituent atoms 1 on the surface thereof are terminated by proper atoms or molecules 2 to make the substrate material non-conductive. In this embodiment, a silicon (100) substrate is used which is exposed to atomic hydrogens in an ultrahigh vacuum atmosphere to terminate surface dangling bonds with hydrogen atoms. Constituent elements 1 are not necessarily silicon, but other semiconductors or insulators such as silicon carbide and gallium arsenide may be used. Hydrogen is often used as atoms or molecules 2 for the termination of dangling bonds. However, other atoms or molecules may be used in this invention so long as they satisfy two points, one being the capability of terminating dangling bonds on the substrate surface and the other being the capability of making the substrate non-conductive by the termination. A silicon substrate (100) has a surface reconstitution forming a dimer of silicon atoms on the outermost layer, and this reconstitution is maintained after hydrogen termination. This invention is independent from any details of such surface reconstitution.

It is possible to extract one atom or molecule or several atoms or molecules 2 (in this embodiment, hydrogen) from the surface of this substrate placed in an ultrahigh vacuum atmosphere, by applying a proper voltage pulse to the probe of a scanning tunneling microscope positioned near to the substrate surface. By repeating this operation by moving the position of the probe when each voltage pulse is applied or while a voltage pulse is continuously applied, a row of terminated atoms or molecules 2 can be extracted from the substrate surface. In this embodiment, the structure with one row of hydrogen atoms being extracted was fabricated. It is also possible to fabricate the structure with a plurality or rows of atoms being extracted, by changing the amplitude of an applied voltage pulse or the amount of tunneling current passing between the probe and substrate surface. Also in the case of a plurality of rows of atoms, a conductive fine wire can be fabricated in quite the same manner as will be described hereinafter.

Next, a small number of metal atoms 3 are sequentially supplied to the substrate. In this embodiment, gallium atoms were supplied from a thermal deposition doser. An area of the substrate surface where dangling bonds are exposed by extraction of terminated atoms or molecules 2, is more chemically active more-than the area where dangling bonds are terminated. Therefore, supplied metal atoms 3 are more likely to be adsorbed to the dangling bonds than to the terminated bonds. Gallium atoms have a very high motion speed on the hydrogen-terminated substrate surface at a room temperature, so that supplied atoms are adsorbed only to dangling bonds. Energy of atoms adsorbed to dangling bonds is more stable than for atoms adsorbed to terminated bonds, which is common not only to gallium atoms but to all metal atoms. However, a motion speed on the non-conductive surface depends on the kind of supplied atoms, and some atoms having a very low motion speed are not selectively adsorbed to dangling bonds in some cases. For example, this case occurs when titanium atoms are supplied to the substrate of this embodiment. In such a case, atoms adsorbed to the terminated bonds are transferred to dangling bonds by using a scanning tunneling microscope or an atomic force microscope, in order to attain similar effects to the case of gallium. The invention is therefore applicable not only to gallium but also arbitrary metal atom species.

Although a dangling bond wire of this embodiment is conductive before metal atoms 3 are adsorbed, it loses conductivity after a small number of metal atoms 3 are supplied. Thereafter, the conductivity continues to be lost until all dangling bonds are terminated by just the same number of supplied atoms. In order to make this fine wire conductive, metal atoms 3 are further supplied after the same number of supplied atoms 3 are absorbed to dangling bonds. In this embodiment, after it is confirmed that all dangling bonds are terminated by gallium atoms, one additional gallium atom is supplied and a small potential difference (10 mV) is applied across the fine wire to measure an electrical resistance. It is known that a narrow conductive path (several tens nm wide or less) as in the case of this embodiment has an electrical resistance of 12.7 kΩ specific to this shape of the conductive path. A substantial conductivity of the gallium atom fine wire of this embodiment is therefore expected to be much higher than that calculated from this resistance value. Thereafter, a small number of gallium atoms were sequentially supplied until an area (1 nm square) was formed which is known conventionally as maintaining conductivity. The conductivity of the embodiment fine wire was maintained during this period.

Figure 2A:
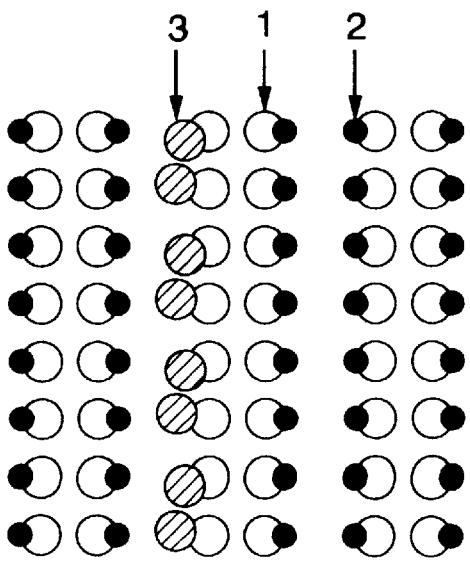
FIGS. 2A and 2B are diagrams showing an example of the atom configuration of a fine wire in which metal atoms corresponding in number to just the same as that required for terminating dangling bonds are supplied, as viewed downwards and viewed sidewards, respectively.
Figure 2B:
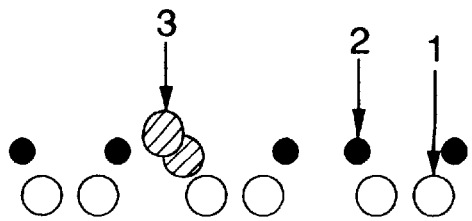
Figure 3:
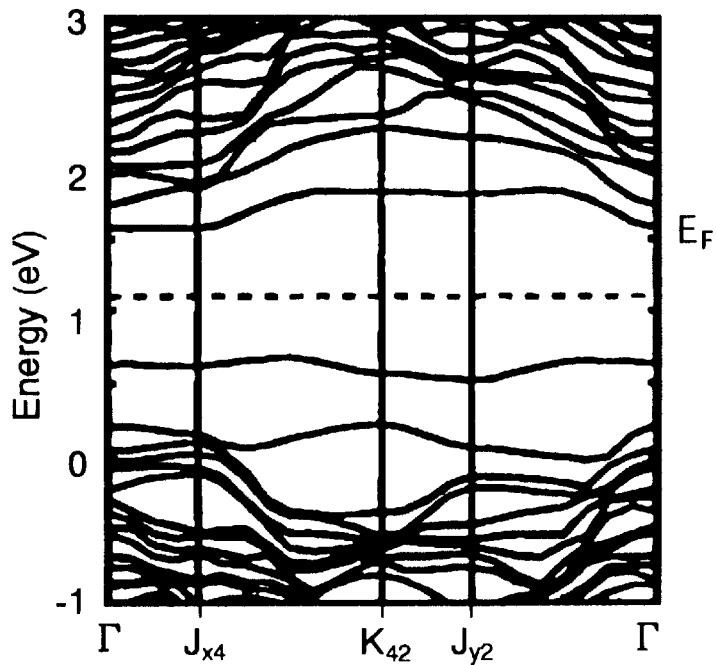
FIG. 3 is a diagram showing an energy band structure of the fine wire shown in FIGS. 2A and 2B.

Adequacy of the above results was confirmed through the detailed studies incorporating first-principles calculations. The surface configuration when gallium atoms are the same in number as that of dangling bonds are adsorbed, was analyzed from the observation results by a scanning tunneling microscope together with first-principles calculations. It was found that the surface configuration was as shown in FIGS. 2A and 2B. FIG. 2A shows the surface configuration as viewed downwards and FIG. 2B shows the surface configuration as viewed sidewards. The calculation results of the energy band structure of this fine wire are shown in FIG. 3. As seen from FIG. 3, although an energy band derived from a row of dangling bonds and adsorbed gallium atoms appears in the energy gap on the hydrogen-terminated silicon surface, this energy band structure still maintains a semiconducting electron state having an energy gap. This is the reason for non-conductivity of the fine wire. If the number of gallium atoms is less than that shown in FIGS. 2A and 2B, the atom configuration similar to FIGS. 2A and 2B is locally formed so that the fine wire becomes non-conductive.

Figure 4A:
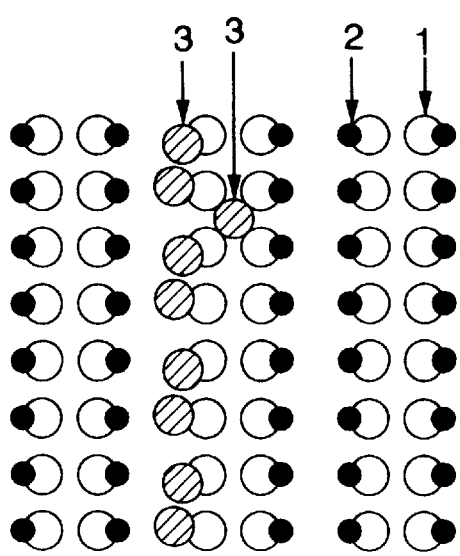
FIG. 4A is a diagram showing an example of the atom configuration of an atomic-size conductive fine wire as viewed downwards according to the invention.
Figure 4B:
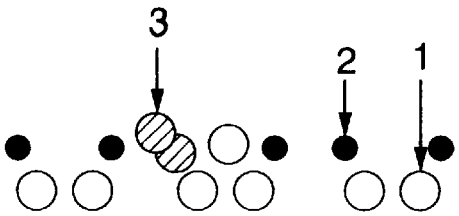
FIG. 4B is a diagram showing an example of the atom configuration of the atomic-size conductive fine wire shown in FIG. 4B as viewed sidewards.
Figure 5:
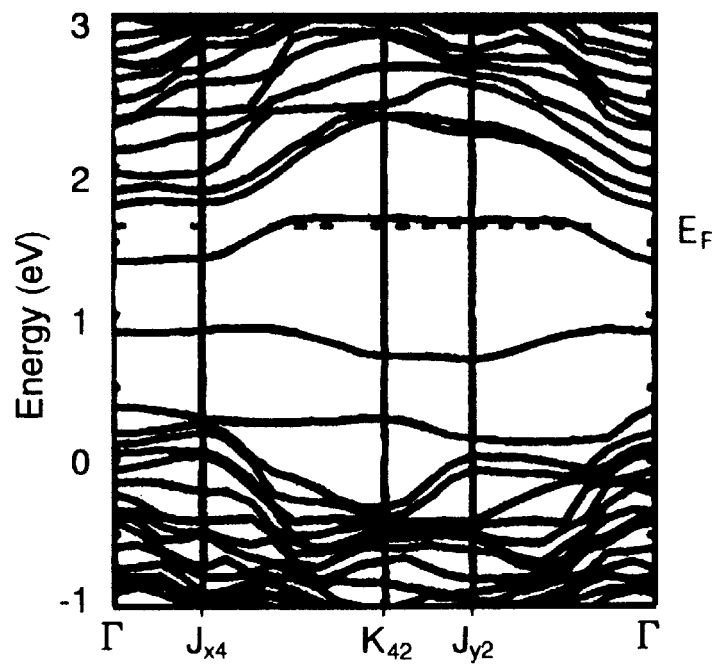
FIG. 5 is a diagram showing an energy band structure of the fine wire shown in FIGS. 4A and 4B.

In contrast to the above, the number of supplied gallium atoms was increased by 50% from that shown in FIGS. 2A and 2B. The resultant gallium atom adsorption location and its energy band structure being shown in FIGS. 4A and 4B and FIG. 5. FIG. 4A is a plan view and FIG. 4B is a side view. As seen from FIG. 5, the distinctive features of this fine wire reside in that it behaves like metal and the shape of the energy band which appears in the energy gap is almost the same as FIG. 3 excepting a different position of only the energy level. This means that gallium atoms supplied after the configuration shown in FIGS. 2A and 2B do not disturb the energy band but simply supply electric charges to this energy band. This means further not that the fine wire becomes conductive at a particular value of an increase of gallium atoms by 50% more than the state shown in FIGS. 2A and 2B, but that it shows conductivity by all means if gallium atoms are added to the state shown in FIGS. 2A and 2B irrespective of its amount.

The configurations of gallium atoms shown in FIGS. 2A and 2B and FIGS. 4A and 4B are inherent to a combination of the embodiment substrate and gallium atoms, and change depending upon the kinds of a substrate, terminated atoms, and supplied metal atoms. The configurations also change with a substrate surface from which terminated atoms are extracted. The energy band structures shown in FIGS. 3 and 5 also change correspondingly. Irrespective of the kinds of substrate, terminated atoms, and supplied metal atoms, however, the above distinctive features are satisfied. Namely, an energy band derived from a row of dangling bonds and adsorbed gallium atoms appears in the energy gap, and even if metal atoms are further supplied after metal atoms the same in number to that just terminating all dangling bonds are supplied, the shape of the energy band which appears in the energy gap does not change and only the energy level thereof changes. These distinctive features of this embodiment were confirmed also when the silicon substrate was replaced by a diamond substrate and supplied gallium atoms were replaced by titanium atoms.

The atomic-size fine wire fabricated by this embodiment ensures stability and conductivity even after it is transferred from a ultrahigh vacuum atmosphere to the atmospheric air. In order to further improve stability, it is very effective to deposit insulating material on the substrate surface after the fine wire is formed. The fabrication method of this invention is effective for fine wires in the range from one dangling bond row to 20 dangling bond rows from which terminated atoms are extracted, and in the range of supplied metal atoms up to 100 times that of dangling bonds. The invention is particularly effective, however, from the viewpoint of feasibility of the control of the number of atoms, for the number of rows up to five rows and the number of supplied atoms up to 10 times that of the dangling bonds.

(2nd Embodiment)

Figure 6:
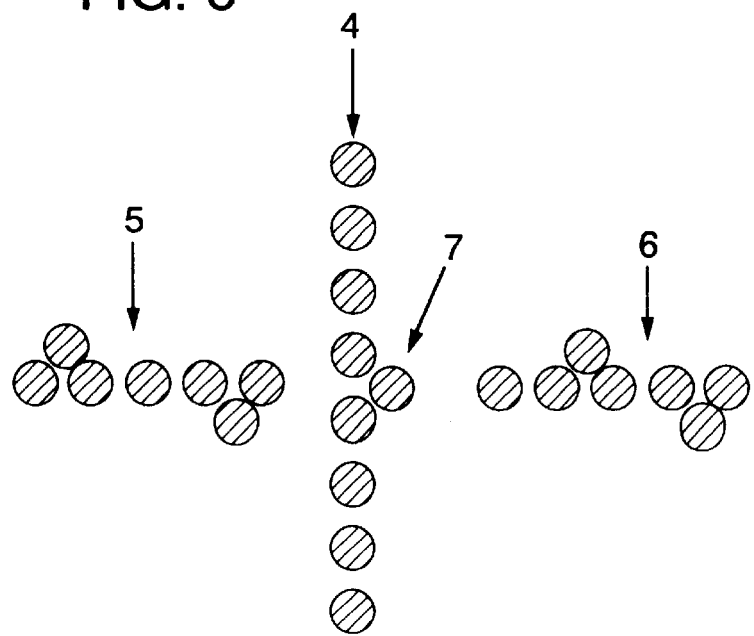
FIG. 6 is a diagram showing an example of the structure of an atomic-size switching element according to the invention.

This embodiment discloses the structure of a switching element realized by changing the conductivity of atomic-size fine wires. The outline of the configuration of a switching element is shown in FIG. 6. This switching element is constituted of three atomic-size fine wires 4, 5 and 6. The fine wire 4 has adsorbed atoms whose number is larger than dangling bonds by one. As described in the first embodiment, the position of an absorbed atom until the numbers of dangling bonds and adsorbed atoms become equal is different from the position of an atom absorbed thereafter. In the case of the fine wire 4, the latter position corresponds to that of an atom 7 only. This atom 7 is called a switching atom hereinafter. The fine wires 5 and 6 are disposed facing the switching atom 7. As different from the fine wire 4, the number of absorbed atoms of the fine wires 5 and 6 may be an arbitrary number more than that of dangling bonds 5.

In the switching element shown in FIG. 6, the adsorption energy of the switching atom 7 is lower than that of other atoms constituting the fine wire 4. Therefore, as a positive voltage is applied to the fine wire 5 or 6, only the switching atom 7 moves to the fine wire 5 or 6. As the switching atom 7 moves apart from the fine wire 4, electric charges move from the fine wire 4 to the switching atom 7. Therefore, as the switching element 7 moves away from the fine wire 4, this fine wire 4 becomes non-conductive. In this manner, the fine wire 4 can be switched from a conductive state to a non-conductive state. Conversely, in order to change the fine wire 4 from the non-conductive state to the conductive state, a positive voltage is applied to the fine wire 6 if the switching atom 7 is on the side of the fine wire 7 or to the fine wire 5 if the switching atom 7 is on the side of the fine wire 6, to thereby return the switching atom 7 back to the initial position. In this embodiment, similar to the first embodiment, the fine wires 4, 5 and 6 were fabricated by using a hydrogen-terminated silicon substrate and gallium atoms. A transfer of the switching atom was confirmed upon application of a voltage of 0.1 V to the fine wire 5 or 6.

An atomic switch (refer to JP-A-5-175513) is already known, which is similar to the switching element of this invention which changes the conductivity of an atomic-size fine wire. However, the invention has an essential different point from this atomic switch. Specifically, a conventional atomic switch uses the switching element itself as part of a conductive path and this path is connected or disconnected for the switching operation in accordance with a position of the switching atom. The switching atom of this invention does not constitute a conductive path, but a motion of the switching element changes the electron state of the conductive path. Therefore, the switching operation is achieved by changing the total conductivity of the fine wire.

This invention has specific points as described above which are different from other preceding inventions. However, since the essential function of a switching element is the same, logic circuits can be configured in similar manners to those disclosed in JP-A-5-175513.

According to the invention, it becomes possible to fabricate atomic-size fine wires having structural stability. Accordingly, wiring interconnections between elements having an atomic-size width can be realized and high integration and high density of atomic-size or nanometer-size elements become possible. Furthermore, according to the invention, switching elements having structural stability better than conventional atomic-size switches can be realized.

What is claimed is:

1. An atomic-size conductive fine wire comprising metal atoms adsorbed to a row of dangling bonds formed through extraction of a row of atoms or molecules terminated to the surface of semiconductor or insulator crystals made non-conductive by terminating dangling bonds on the surface thereof with atoms or molecules.

2. An atomic-size conductive fine wire according to claim 1, wherein the number of adsorbed metal atoms is larger than, and smaller than ten times, the number of dangling bonds formed on the surface through extraction.

3. An atomic-size conductive fine wire according to claim 1, wherein a width of dangling bonds formed on the surface through extraction is one row or more and five rows or less.

4. An atomic-size conductive fine wire according to claim 1, wherein the adsorbed metal atoms are gallium atoms.

5. An atomic-size conductive fine wire comprising metal atoms adsorbed to a row of dangling bonds formed through extraction of a row of atoms or molecules terminated to the surface of semiconductor or insulator crystals made non-conductive by terminating all dangling bonds on the surface thereof with atoms or molecules, wherein an energy band derived from the metal atoms appears in the energy gap on said surface of semiconductor or insulator crystals, and wherein said metal atoms supply electric charges to the energy band.

6. An atomic-size conductive fine wire according to claim 5, wherein the number of adsorbed metal atoms is larger than, and smaller than ten times, the number of dangling bonds formed on the surface through extraction.

7. An atomic-size conductive fine wire according to claim 5, wherein a width of dangling bonds formed on the surface through extraction is one row or more and five rows or less.

8. An atomic-size conductive fine wire according to claim 5, wherein the adsorbed metal atoms are gallium atoms.

9. An atomic-size switch comprising atomic-size conductive fine wires each comprising metal atoms adsorbed to a row of dangling bonds formed through extraction of a row of atoms or molecules terminated to the surface of semiconductor or insulator crystals made non-conductive by terminating all dangling bonds on the surface thereof with atoms or molecules, wherein the number of adsorbed metal atoms is larger than dangling bonds by one, and a conductivity of the atomic-size conductive fine wire is changed by moving the position of the one additional metal atom.

10. An atomic-size conductive fine wire comprising metal atoms adsorbed to a row of dangling bonds formed through extraction of a row of hydrogen atoms terminated to the surface of silicon crystals made non-conductive by terminating dangling bonds on the surface thereof with hydrogen atoms, wherein an energy band derived from metal atoms adsorbed on dangling bonds appears in the energy gap on the hydrogen-terminated silicon surface and said metal atoms supply electric charges to the energy band.

* * * * *